(12) United States Patent
Kanda

(10) Patent No.: US 6,233,042 B1
(45) Date of Patent: *May 15, 2001

(54) PROJECTION EXPOSURE APPARATUS AND DEVICE MANUFACTURING METHOD USING THE SAME

(75) Inventor: Tsuneo Kanda, Utsunomiya (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/178,628

(22) Filed: Oct. 26, 1998

(30) Foreign Application Priority Data

Oct. 29, 1997 (JP) .................................. 9-312728

(51) Int. Cl.$^7$ ............................ G03B 27/42; G01B 11/00
(52) U.S. Cl. ............................................. 355/53; 356/401
(58) Field of Search .......................... 355/53.01, 53.1, 355/53.16, 53.2, 53.22, 53.24, 53.3, 53.5, 53, 67, 71; 356/399, 400, 401; 250/201.2, 201.4, 203.1; 353/101

(56) References Cited

U.S. PATENT DOCUMENTS

| | | | |
|---|---|---|---|
| 5,105,075 | * 4/1992 | Ohta et al. | 250/201.2 |
| 5,483,056 | 1/1996 | Imai | 250/201.4 |
| 5,808,724 | * 9/1998 | Ina et al. | 355/53 |
| 5,872,618 | * 2/1999 | Nagayama et al. | 355/53 |
| 6,110,021 | * 8/2000 | Ota et al. | 451/159 |

FOREIGN PATENT DOCUMENTS 95-12572   5/1995  (KR).

* cited by examiner

Primary Examiner—Alan A. Mathews
Assistant Examiner—Rodney Fuller
(74) Attorney, Agent, or Firm—Fitzpatrick, Cella, Harper & Scinto

(57) ABSTRACT

A projection exposure apparatus includes a projection optical system for projecting a pattern of a first object onto a second object, a correcting mechanism for changing an optical characteristic of the projection optical system, a positional information detecting device for detecting a relative positional relationship between first and second marks, which are disposed at different positions, wherein the positional information detecting device detects the first mark with the use of the projection optical system and without the use of the second mark, and detects the second mark without the use of the projection optical system, a discriminating device operable, after the detection of the relative positional relationship by the positional information detecting device is repeated at a predetermined time interval or successively, to discriminate a relation between first positional information obtained as a result of an earlier detection and second positional information obtained as a result of a later detection made by the positional information detecting device, and an actuator for actuating the correcting mechanism on the basis of the discrimination made by the discriminating device, to change the optical characteristic of the projection optical system.

13 Claims, 13 Drawing Sheets

PROJECTION EXPOSURE APPARATUS AND DEVICE MANUFACTURING METHOD USING THE SAME

FIELD OF THE INVENTION AND RELATED ART

This invention relates to a projection exposure apparatus and a device manufacturing method using the same. The present invention is particularly suitable for printing, through projection exposure, a pattern of a first object onto a second object in a step-and-repeat or step-and-scan method to produce large integration devices of submicron or quarter-micron order, such as semiconductor devices (e.g., IC or LSI), CCDs, liquid crystal panels, for example.

Semiconductor technology is being advanced remarkably, and micro-fabrication techniques are also being advanced notably. Particularly, as regards optical processing techniques using semiconductor projection exposure apparatuses, submicron orders are currently aimed at with 1 MDRAM.

Conventional attempts for enhancement of resolving power in semiconductor projection exposure apparatuses are a method in which the numerical aperture (NA) of a projection optical system is enlarged, and a method in which the wavelength of exposure light is shortened by using i-line in place of g-line, or by using an emission wavelength of an excimer laser (e.g., 248 nm, 193 nm, or 157 nm). Recent attempts are the use of a phase shift mask or a modified illumination method to expand the limitation of optical processing based on optical exposure.

On the other hand, with increases of resolving power, the control of semiconductor processes has become very strict. This causes a notable reduction of process margin, for example, such as tolerance for variation of linewidth in processes or tolerance for total overlay.

SUMMARY OF THE INVENTION

In projection exposure apparatuses, called a stepper, in which a pattern formed on a surface to be illuminated is illuminated by an illumination system with light from a light source and the illuminated pattern is projected and printed on a substrate by means of a projection exposure apparatus, generally the apparatus is set to provide a higher throughput, i.e., a higher yield of semiconductor devices per unit time. For increased yield, the speed of various sequences or the operation time of moving components has to be quickened. This applies also to exposure of a shot. The time necessary for the exposure operation has to be reduced and, to this end, the illuminance of exposure light upon the surface of a wafer has to be increased to quicken sensitization of a resist material.

When higher illuminance is used, while it may depend on the transmissivity of a reticle used, the energy to be applied to a projection optical system in the exposure process per unit time increases. Since the number of wafers to be processed increases, the total amount of energy to be applied to the projection optical system is enormously large. A portion of such energy is absorbed by a glass material used in the projection optical system through which the exposure light passes.

The absorbed energy of exposure light is accumulated, causing thermal deformation, for example, of components of the projection optical system and producing deterioration of the optical characteristic thereof. This is called thermal aberration. This problem becomes more serious particularly with continuing miniaturization of electronic circuit patterns.

Conventionally, in this connection, an optical characteristic of a projection optical system is measured at a certain time interval to monitor any change in optical characteristic, or such change with time is predicted by using software, and a portion of the projection exposure apparatus is actuated to perform correction.

However, if an optical characteristic of a projection optical system is measured at a certain interval, the measurement takes time which directly leads to a decrease of throughput. If software prediction is used, specific parameters have to be prepared and inputted since every machine has its own operational characteristic. This is very cumbersome. Further, prediction by software could not meet a possible deviation of what actually occurs from what is predicted, and it could not monitor the deviation.

It is an object of the present invention to provide a projection exposure apparatus and/or a device manufacturing method using the same, by which any change in optical characteristic of a projection optical system can be detected and corrected in real time to thereby assure high precision projection exposure.

In accordance with an aspect of the present invention, there is provided a projection exposure apparatus, comprising: a projection optical system for projecting a pattern of a first object onto a second object; a correcting mechanism for changing an optical characteristic of said projection optical system; positional information detecting means for detecting a first mark with said projection optical system and for detecting a second mark without said projection optical system to detect a relative positional relationship between the first and second marks which are disposed at different positions; discriminating means operable, after the detection of the relative positional relationship by said positional information detecting means is repeated at a predetermined time interval or successively, to discriminate a relation between first positional information obtained as a result of earlier detection and second positional information obtained as a result of later detection made by said positional information detecting means; and actuating means for actuating said correcting mechanism on the basis of the discrimination made by said discriminating means, to change the optical characteristic of said projection optical system.

In this aspect of the invention, said discriminating means may discriminate whether the second positional information contains a change not less than a predetermined amount as compared with the first positional information.

Said positional information detecting means may detect the relative positional relationship between the first and second marks on the basis of photoelectric conversion of images of the first and second marks, respectively, as formed upon a predetermined plane.

The first mark may comprise a lens monitoring reference mark whose imaging position upon a predetermined plane is shiftable with the optical characteristic of said projection optical system, and the second mark may comprise a reference mark whose imaging position upon a predetermined plane is not shiftable.

Said positional information detecting means may detect imagewise information about the first mark as defined on a predetermined plane to detect a change in imaging plane of said projection optical system.

The apparatus may further comprise a stage for holding the second object, wherein said stage may be moved in accordance with the change in imaging plane of said projection optical system as detected by said positional information detecting means.

In accordance with another aspect of the present invention, there is provided a device manufacturing method, comprising the steps of: transferring a pattern of a reticle onto a surface of a wafer through a projection optical system of a projection exposure apparatus such as recited above; and developing the wafer for production of a device.

Generally, in accordance with the present invention, any change in optical characteristic of a projection optical system can be detected in real time, and on the basis of which the optical characteristic of the projection optical system can be corrected. Thus, the present invention provides a projection exposure apparatus and/or a device manufacturing method using the same by which high precision projection exposure is assured. Further, in accordance with the present invention, the state of a projection lens can be monitored continuously regardless of the sequence in which the projection exposure apparatus is held at that time. Therefore, the optical performance of the projection optical system can be corrected in real time on the basis of the monitoring, such that high precision exposure performance is provided constantly.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

Figure 1:
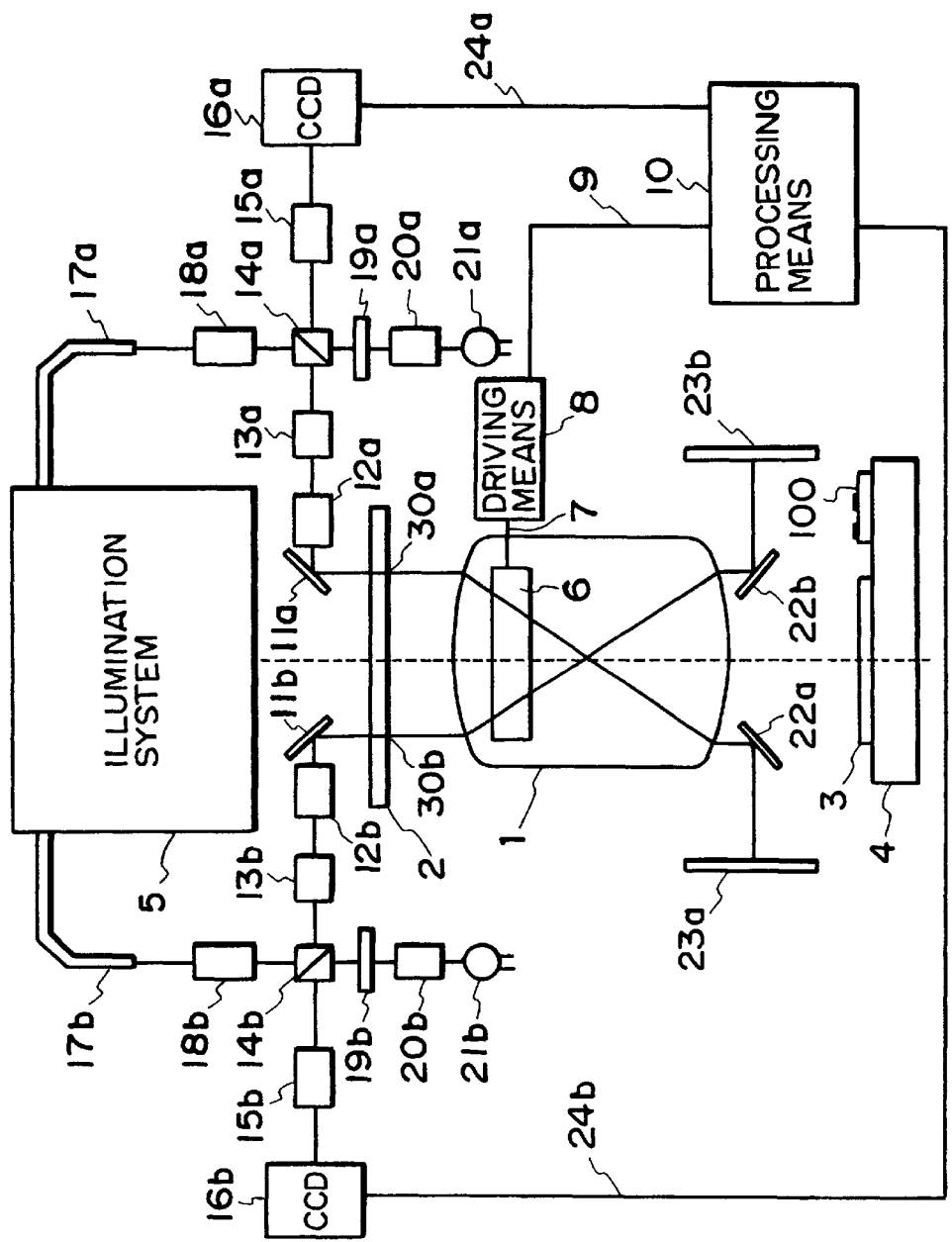
FIG. 1 is a schematic view of a main portion of a projection exposure apparatus according to a first embodiment of the present invention.

FIG. 1 shows a main portion of a projection exposure apparatus according to a first embodiment of the present invention. In the drawing, exposure light emitted from an exposure illumination system 5 having a light source such as an excimer laser, for example, illuminates an electronic circuit pattern formed on the surface of a reticle 2.

The reticle 2 is placed on a reticle stage, not shown. The reticle stage is provided with a reticle reference mark (not shown) to be used for setting the reticle 2 with respect to the major assembly of the projection exposure apparatus. The electronic circuit pattern formed on the reticle 2 is transferred and printed on a wafer 3 through a projection lens (projection optical system 1. After this, the wafer is treated by a developing process by which devices are produced on the wafer 3.

The wafer is placed on a chuck, not shown. The wafer chuck is mounted on an X-Y-Z-θ stage 4 which is movable along a plane (X-Y plane) perpendicular to the optical axis of the projection lens 1, along an optical axis (Z axis) direction, and in a rotational (θ) direction about the optical axis. The wafer chuck serves to move the wafer 3 in the X and Y directions as well as in the optical axis (Z axis) direction which is the focusing direction.

The projection lens 1 has a correcting mechanism 6 contained therein, for changing the optical characteristic of the projection lens 1. The correcting mechanism 6 is operable in response to a signal supplied from a driving circuit 8 through a communication line 7. The driving circuit 8 receives a signal from a processing means 10 through a line 9, representing the amount of drive for the correcting mechanism 6.

Disposed between the reticle 2 and the exposure illumination system 5 are portions (11, 12) of observation optical systems, at four locations (FIG. 3), for observation of marks through the projection lens 1 in the manner to be described later. Denoted at 11 (11a–11d) are mirrors for reflecting light, for observation of marks 23 (23a–23d) through the reticle 2 and the projection lens 1. Denoted at 12 (12a–12d) are objective lenses.

Figure 3:
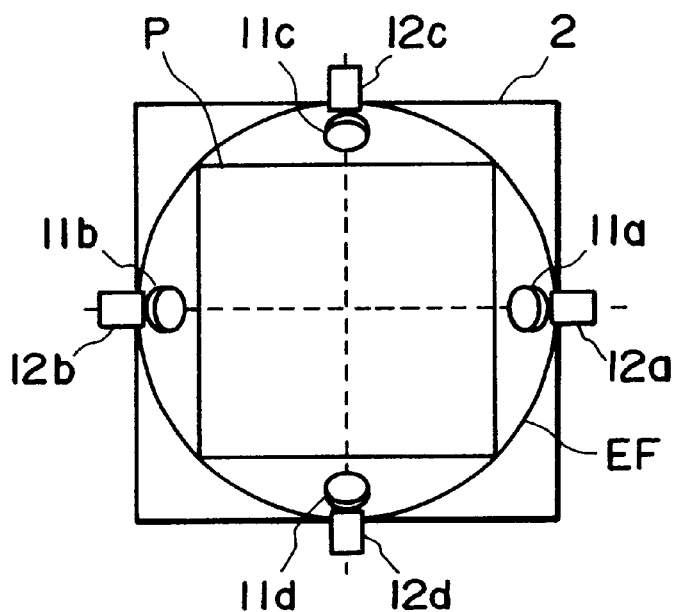
FIG. 3 is a schematic view for explaining placement of alignment microscopes of the first embodiment of the present invention.

The optical arrangement after the objective lens 12 is omitted in FIG. 3. As shown in FIG. 3, there are four observation optical systems disposed above the reticle 2, which optical systems are components of positional information detecting means. While this embodiment uses four observation optical systems, any plural number may be adopted. In FIG. 3, denoted at EF is the exposure field provided by the projection lens 1, and denoted at P is the range of an electronic circuit pattern formed on the reticle 2. The observation optical systems have their optical components disposed so as not to interfere with exposure illumination light as the pattern in the range P is transferred to the wafer 3.

Figure 15:
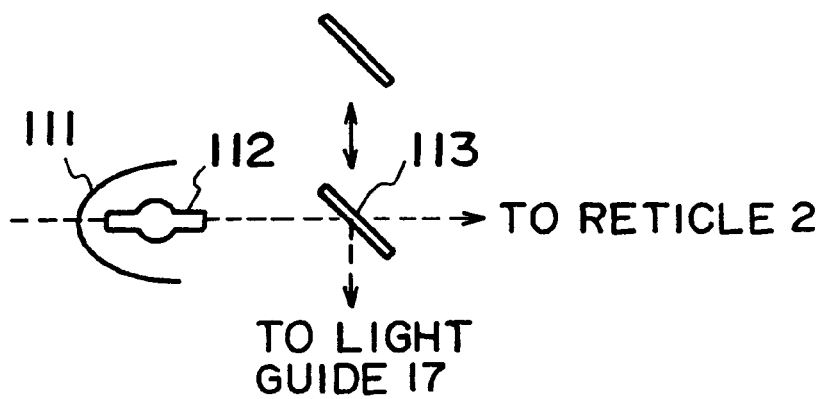
FIG. 15 is a schematic view for explaining a branch where monitoring light is supplied from an exposure illumination system in the first embodiment of the present invention.

Referring back to FIG. 1, a description will be made of components 11a–24a of one observation optical system at the right-hand side, for example, denoted by reference numerals with a suffix "a". A portion of exposure light from the exposure illumination system 5 is guided by a light guide 17a into a microscope illumination optical system (illumination optical system) 18a. Here, within the illumination optical system 5, as shown in FIG. 15, a mirror 113 is selectively shifted as denoted by an arrow to alternately guide the light from a light source 112 toward the light guide 17 or the reticle 2.

Figure 16:
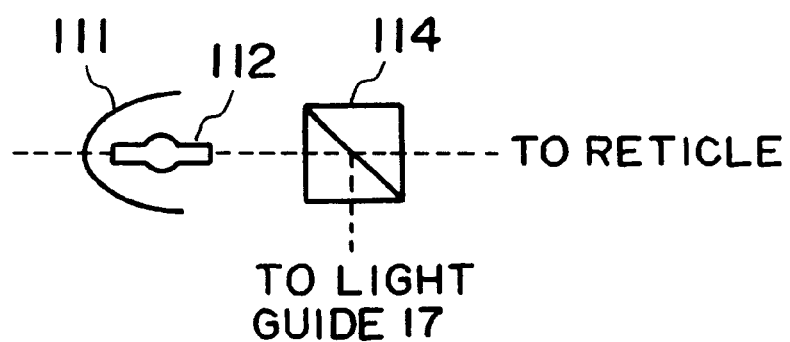
FIG. 16 is a schematic view for explaining another example of a branch where monitoring light is supplied from the exposure illumination system of the first embodiment of the present invention.

If the above-described structure of the switching mirror 113 is difficult to adopt for any structural, reason, the mirror may be replaced by a half mirror 114 as shown in FIG. 16 to guide the light from the light source 112 toward the light guide (fiber) 17 and the reticle 2.

Figure 2:
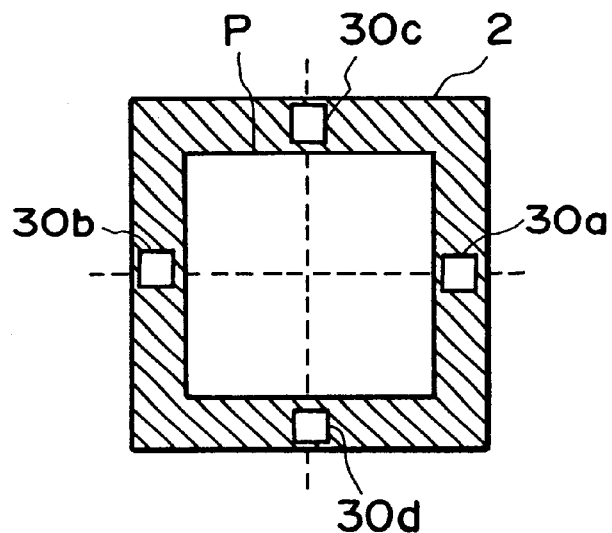
FIG. 2 is a schematic view for explaining placement of windows in a reticle usable in the first embodiment of the present invention.

The light entering the microscope illumination optical system 18a from the light guide 17 passes the illumination optical system 18a and, after this, it is reflected by a beam splitter 14a and is projected on a relay lens 13a. Subsequently, the light passes the objective lens 12a and it is reflected by the mirror 11a toward the reticle 2. The reflected light passes a transmission window 30a formed on the reticle 2. This transmission window 30a is one of four transmission windows 30a–30d which are formed on the reticle 2 in accordance with the positions of the observation optical systems, such as shown in FIG. 2. The positions of these windows are out of the electronic circuit pattern range P to avoid physical interference with the circuit pattern P, such that there is no restriction produced in relation to the circuit pattern P.

Figure 4:
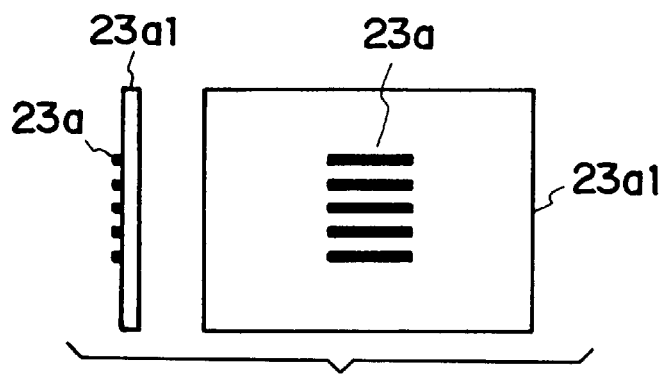
FIG. 4 is a schematic view for explaining a lens monitoring reference mark usable in the first embodiment of the present invention.

The light passing through the transmission window 30a of the reticle 2 goes through the projection lens 1, and it is reflected by a mirror 22a to illuminate a lens monitoring reference mark (first mark) 23a. The lens monitoring reference mark 23a comprises a pattern, as shown in FIG. 4, having linear mark elements disposed with a predetermined pitch. For example, it is provided on a substrate 23a1 by using a reflective material such as Cr. for example. The light as reflected by the lens monitoring reference mark 23a is then reflected by the mirror 22a and, subsequently, after passing through the projection lens 1 and the window 30a of the reticle 2, it impinges on the mirror 11a of the observation optical system.

The light is reflected by the mirror 11a and, after passing through the objective lens 12a and the relay lens 13a, it passes through the beam splitter 14a. Subsequently, it goes through an erector lens 15a and, then, it forms an image 23a2 of the lens monitoring reference mark 23a upon a photoelectric converting device of a CCD camera 16a.

Figure 5:
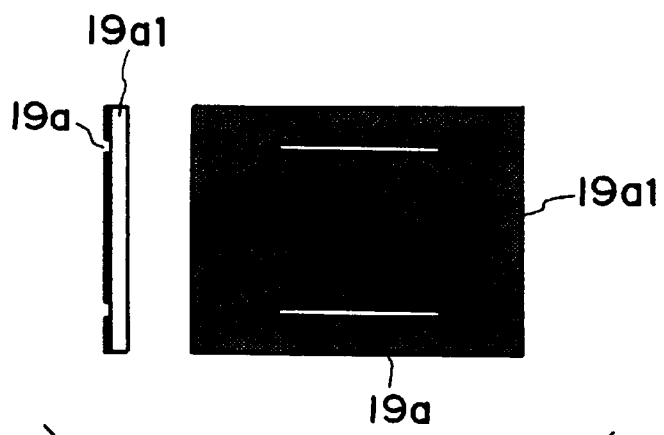
FIG. 5 is a schematic view for explaining a microscope reference mark usable in the first embodiment of the present invention.

On the other hand, a light source 21a produces light of a wavelength different from the exposure light, and this light goes through a microscope reference mark illuminating optical system 20a. Then, the light transmissively illuminates a microscope reference mark (second mark) 19a. As shown in FIG. 5, the microscope reference mark 19a comprises two slit-like transparent patterns which are provided on a substrate 19a1 by using a light blocking material such as Cr, for example. While, in this embodiment, the illumination light for the microscope reference mark 19a has a wavelength different from the exposure light, the same wavelength may be used.

Figure 6:
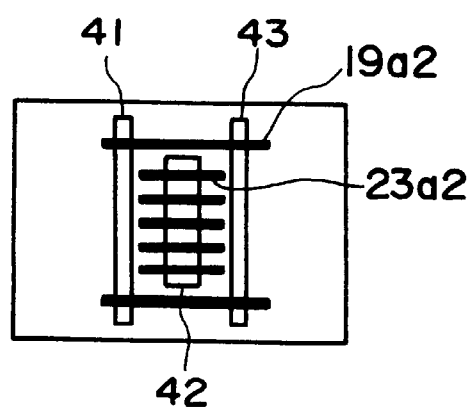
FIG. 6 is a schematic view for explaining placement of a measuring window in the first embodiment of the present invention.

The light passing through the microscope reference mark 19a is reflected by the beam splitter 14a and, after passing through the erector lens 15a, it forms an image 19a2 of the microscope reference mark 19a upon the photoelectric converting device of the CCD camera 16a. Thus, upon the photoelectric conversion surface of the CCD camera 16a, two images, that is, the lens monitoring reference mark image 23a2 and the microscope reference mark image 19a2 are imaged, as shown in FIG. 6. Namely, the photoelectric conversion surface of the CCD camera 16a is in an optically conjugate relation with the lens monitoring reference mark 23a and the microscope reference mark 19a.

As shown in FIG. 6, the image as transformed into an electrical signal at the photoelectric conversion surface of the CCD camera 16a is transmitted to the processing means 10 through a line 24a. Within the processing means 10, mark position measurement is performed by using a window 42 (FIG. 6) for the lens monitoring reference mark 23a and by using windows 41 and 43 for the microscope reference mark 19a. Then, the processing means 10 calculates a deviation between the marks, on the basis of the positions of the images of the marks 23a and 19a upon the photoelectric conversion surface.

The measurement and calculation operation described above is performed with respect to each of at least two (four in this embodiment) observation optical systems. Then, from the detected deviations, the magnification of the projection lens 1, for example, is calculated. The resultant value of the calculation is stored into a memory (not shown) within the processing means 10, together with the time of the calculation. Further, the measurement and calculation operation described above is repeated at a certain time interval (i.e., periodically) or it is repeated successively. The processing means 10 calculates a difference between a resultant value obtained by an earlier calculation and a resultant value obtained by a later calculation, more specifically, the difference between the value as calculated on the basis of the measurement and calculation operation made at a certain moment and the value as calculated on the basis of the measurement and calculation operation performed later than the certain moment. The thus calculated difference is compared and discriminated by comparing/discriminating means (not shown) within the processing means 10. This is also the case of other embodiments of the present invention to be described later.

The processing means 10 is provided with a driving information table which concerns how the correcting mechanism 6 within the projection lens 1 should be actuated to correct a change in optical characteristic of the projection lens 1, with respect to the above-described difference. Thus, in accordance with the difference detected, the driving amount for the correcting mechanism 6 is outputted to the driving circuit (driving means) 8 through a line 9. In response, the driving circuit 8 drives the correcting mechanism 6 through a line 7, whereby the optical characteristic of the projection lens 1 is corrected. The correcting mechanism 6 operates, for example, to move a predetermined lens or lenses of the component lenses of the projection lens 1 along the optical axis direction or to produce eccentricity therein, to thereby change the optical characteristic.

In this embodiment, the measurement of the deviation as well as the correction of the optical characteristic described above can be executed independently of the operational state of the projection exposure apparatus. Namely, even during execution of exposure operation for an actual device wafer, any change in optical characteristic of the projection lens 1 can be monitored and corrected continuously without applying influence to the exposure process. Thus, a higher throughput is attainable. Further, the history of correction, that is, the data regarding how and what correction has been performed with respect to which process, which wafer, which shot, and the like, may be memorized. The data may be fed back with the proceeding of processes, which may further enhance the exposure precision.

In this embodiment, any change in optical characteristic of the projection lens 1 is monitored by use of the exposure light. However, provided that a change in optical characteristic can be observed, any wavelength other than the exposure light wavelength may be used. On that occasion, there is a possibility that the projection lens 1 produces an on-axis chromatic aberration and that the diameter of the light beam passing through the reticle becomes larger as compared with that of the exposure light If this occurs, the size of the transmitting portion of the reticle 2 has to be changed to meet the beam diameter.

In this embodiment, the monitoring light supplying means uses the structure such as shown in FIG. 15 or 16. The switching mirror 113 in FIG. 15, however, requires a switching mechanism, which may lead to complicatedness. During the exposure process, no light is supplied to the monitoring system, such that complete real time monitoring of a change in optical characteristic of the projection lens 1 is difficult to achieve. With the use of a half mirror in FIG. 16, on the other hand, the illuminance on the wafer surface during the exposure process decreases.

In consideration of theses points, a separate light source may be provided as a light source for monitoring light. This removes the necessity of branching the light from the exposure illumination optical system. Further, if the monitoring light comprises non-exposure light, a separate light source may be used. The half mirror in FIG. 16 may be a dichroic mirror and, on that occasion, the light not to be used for the exposure process can be used as the monitoring light. With this structure, a change in optical characteristic of the projection lens 1 can be monitored continuously without a decrease of illuminance on the wafer surface.

As regards the wavelength of monitoring light and the supply of monitoring light, what has been described above basically applies to other embodiments of the present invention to be described later. Also, it is to be noted that the members denoted at 11a–23a in these embodiments are components of positional information detecting means which includes observation optical systems.

Embodiment 2

Figure 7:
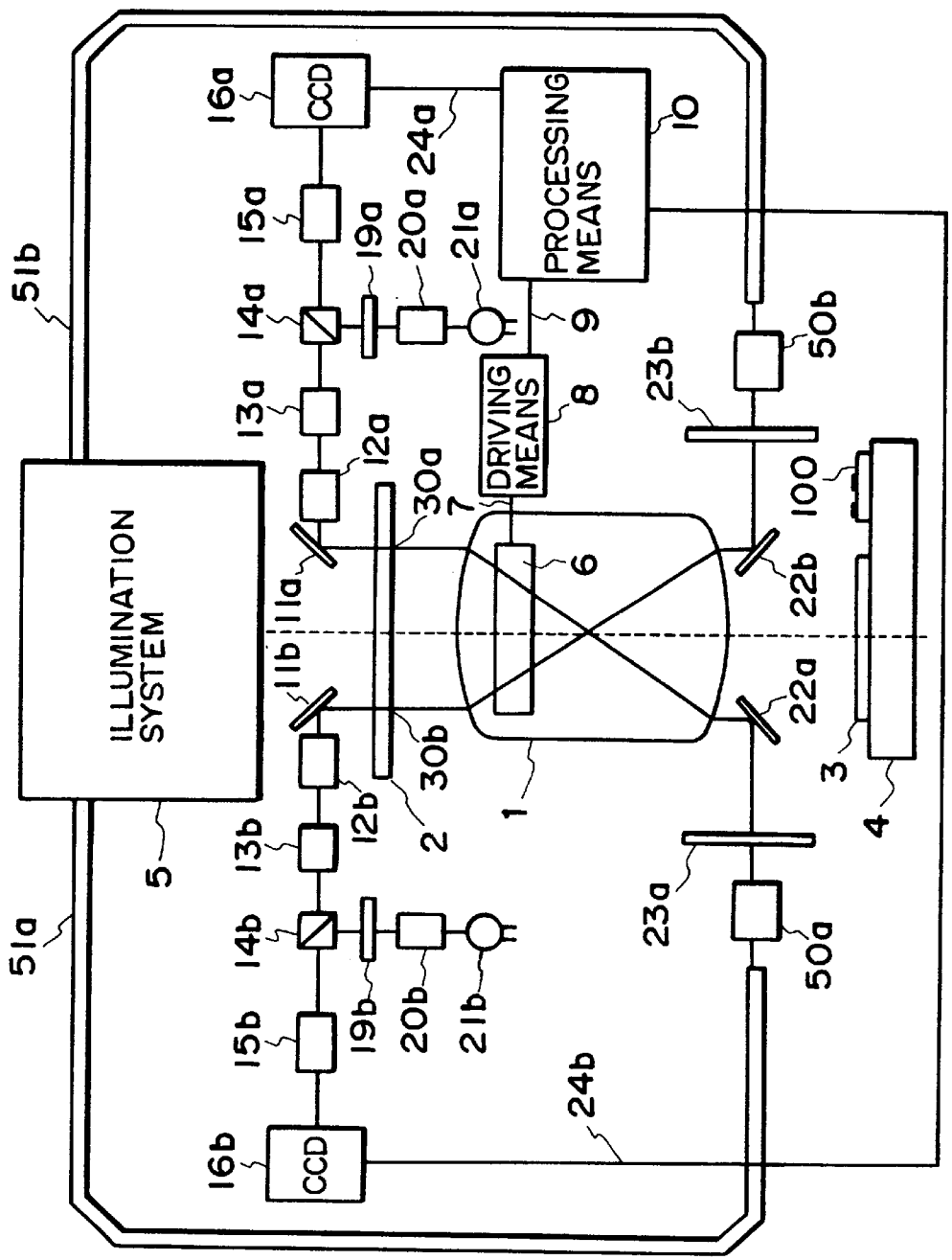
FIG. 7 is a schematic view of a main portion of a projection exposure apparatus according to a second embodiment of the present invention.

FIG. 7 is a schematic view of a main portion of a projection exposure apparatus according to a second embodiment of the present invention. This embodiment differs from the first embodiment in that, while in the first embodiment the lens monitoring reference mark 23 is illuminated perpendicularly, this embodiment uses transmissive illumination to increase the image contrast. The remaining portion has essentially the same structure. The components corresponding to those of the first embodiment are denoted by similar reference numerals.

In FIG. 7, an electronic circuit pattern formed on a reticle 2 is lithographically transferred onto a wafer 3, by exposure light projected from an exposure illumination system 5 and through a projection lens 1.

The reticle 2 is placed on a reticle stage, not shown. The reticle stage is provided with a reticle reference mark (not shown) to be used for setting the reticle 2 with respect to the major assembly of the projection exposure apparatus.

The projection lens 1 has a correcting mechanism 6 contained therein, for changing the optical characteristic of the projection lens 1. The correcting mechanism 6 is operable in response to a signal supplied from a driving circuit 8 through a communication line 7. The driving circuit 8 receives a signal from a processing means 10 through a line 9, representing the amount of drive for the correcting mechanism 6.

A wafer 3 is placed on an X-Y-Z-θ stage 4 through a wafer chuck (not shown). A fiduciary mark 100 is provided on the X-Y-Z-θ stage 4.

Disposed between the reticle 2 and the exposure illumination system 5 are observation optical systems for observation of marks through the projection lens 1, like the first embodiment and as shown in FIG. 3. Denoted at 11 (11a–11d) are mirrors for reflecting light, for observation of marks 23 (23a–23d) through the reticle 2 and the projection lens 1. Denoted at 12 (12a–12d) are objective lenses. The optical arrangement after the objective lens 12 is omitted in FIG. 3.

As shown in FIG. 3, there are four observation optical systems disposed above the reticle 2. While this embodiment uses four observation optical systems, any plural number may be adopted. In FIG. 3, denoted at EF is the exposure field provided by the projection lens 1, and denoted at P is the range of an electronic circuit pattern formed on the reticle 2. The observation optical systems have their optical components disposed so as not to interfere with the exposure illumination light as the pattern in the range P is transferred to the wafer 3.

Next, as in the case of the first embodiment, the description will be made of one observation optical system which is on the right-hand side of FIG. 7. A portion of exposure light from the exposure illumination system 5 is guided by a light guide 51a into a lens monitoring reference mark illumination optical system 50a. The thus projected light transmissively illuminates a lens monitoring reference mark 23a. The lens monitoring reference mark 23a comprises a pattern which corresponds to dark-and-bright inversion of the pattern of FIG. 4 in the first embodiment. Namely, in the first embodiment, the pattern of FIG. 4 comprises a light blocking material (reflective member), whereas in this embodiment the mark portion is defined by a transmissive area and the portion other than the mark portion is provided by a light blocking material.

After passing through the lens monitoring reference mark 23a, the light is reflected by a mirror 22a toward the projection lens 1. Subsequently, the light passes through the projection lens 1 and then through the reticle 2. Here, the light goes through a transmission window 30a formed on the reticle 2. This transmission window 30a is disposed in accordance with the position of the observation optical system, such as shown in FIG. 2. The position of the window is out of the electronic circuit pattern range P to avoid physical interference with the circuit pattern P, such that there is no restriction produced in relation to the circuit pattern P.

The light passing through the transmission window 30a of the reticle 2 impinges on the mirror 11a of the observation optical system. The light is reflected by the mirror 11a and, after passing through the objective lens 12a and the relay lens 13a, it passes through the beam splitter 14a.

Subsequently, it goes through an erector lens 15a and, then, it forms an image 23a2 of the lens monitoring reference mark 23a upon a photoelectric converting device of a CCD camera 16a.

On the other hand, a light source 21a produces light of a wavelength different from the exposure light, and this light goes through a microscope reference mark illuminating optical system 20a. Then, the light transmissively illuminates a microscope reference mark (second mark) 19a. As shown in FIG. 5, the microscope reference mark 19a comprises two slit-like transparent patterns which are provided on a substrate 19a1 by using a light blocking material such as Cr, for example. While, in this embodiment, the illumination light for the microscope reference mark 19a has a wavelength different from the exposure light, the same wavelength may be used.

The light passing through the microscope reference mark 19a is reflected by the beam splitter 14a and, after passing through the erector lens 15a, it forms an image 19a2 of the microscope reference mark 19a upon the photoelectric converting device of the CCD camera 16a. Thus, upon the photoelectric conversion surface of the CCD camera 16a, two images, that is, the lens monitoring reference mark image 23a2 and the microscope reference mark image 19a2 are imaged, such as shown in FIG. 6. Namely, the photoelectric conversion surface of the CCD camera 16a is in an optically conjugate relation with the lens monitoring reference mark 23a and the microscope reference mark 19a.

As shown in FIG. 6, the image as transformed into an electrical signal at the photoelectric conversion surface of the CCD camera 16a is transmitted to the processing means 10 through a line 24a. Within the processing means 10, mark position measurement is performed by using a window 42 (FIG. 6) for the lens monitoring reference mark 23a and by using windows 41 and 43 for the microscope reference mark 19a. Then, the processing means 10 calculates a deviation between the marks, on the basis of the positions of the images of the marks 23a and 19a upon the photoelectric conversion surface.

The measurement and calculation operation described above is performed with respect to each of at least two (four in this embodiment) observation optical systems. Then, from the detected deviations, the magnification of the projection lens 1, for example, is calculated. The resultant value of the calculation is stored into a memory (not shown) within the processing means 10, together with the time of the calculation. Further, the measurement and calculation operation described above is repeated at a certain time interval (i.e., periodically) or it is repeated successively. The processing means 10 calculates a difference between a resultant value obtained by an earlier calculation and a resultant value obtained by a later calculation, more specifically, the difference between the value as calculated on the basis of the measurement and calculation operation made at a certain moment and the value as calculated on the basis of the measurement and calculation operation performed later than the certain moment. The thus calculated difference is compared and discriminated by comparing/discriminating means (not shown) within the processing means 10.

The processing means 10 is provided with a driving information table which concerns how the correcting mechanism 6 within the projection lens 1 should be actuated to correct a change in optical characteristic of the projection lens 1, with respect to the above-described difference. Thus, in accordance with the difference detected, the driving amount for the correcting mechanism 6 is outputted to the driving circuit (driving means) 8 through a line 9. In response, the driving circuit 8 drives the correcting mechanism 6 through a line 7, whereby the optical characteristic of the projection lens 1 is corrected. The correcting mechanism 6 operates, for example, to move a predetermined lens or lenses of the component lenses of the projection lens 1 along the optical axis direction or to produce eccentricity therein, to thereby change the optical characteristic.

In this embodiment, the measurement of deviation as well as the correction of the optical characteristic described above can be executed independently of the operational state of the projection exposure apparatus. Namely, even during execution of an exposure operation for an actual device wafer, any change in optical characteristic of the projection lens 1 can be monitored and corrected continuously without applying influence to the exposure process. Thus, a higher throughput is attainable.

Embodiment 3

Figure 8:
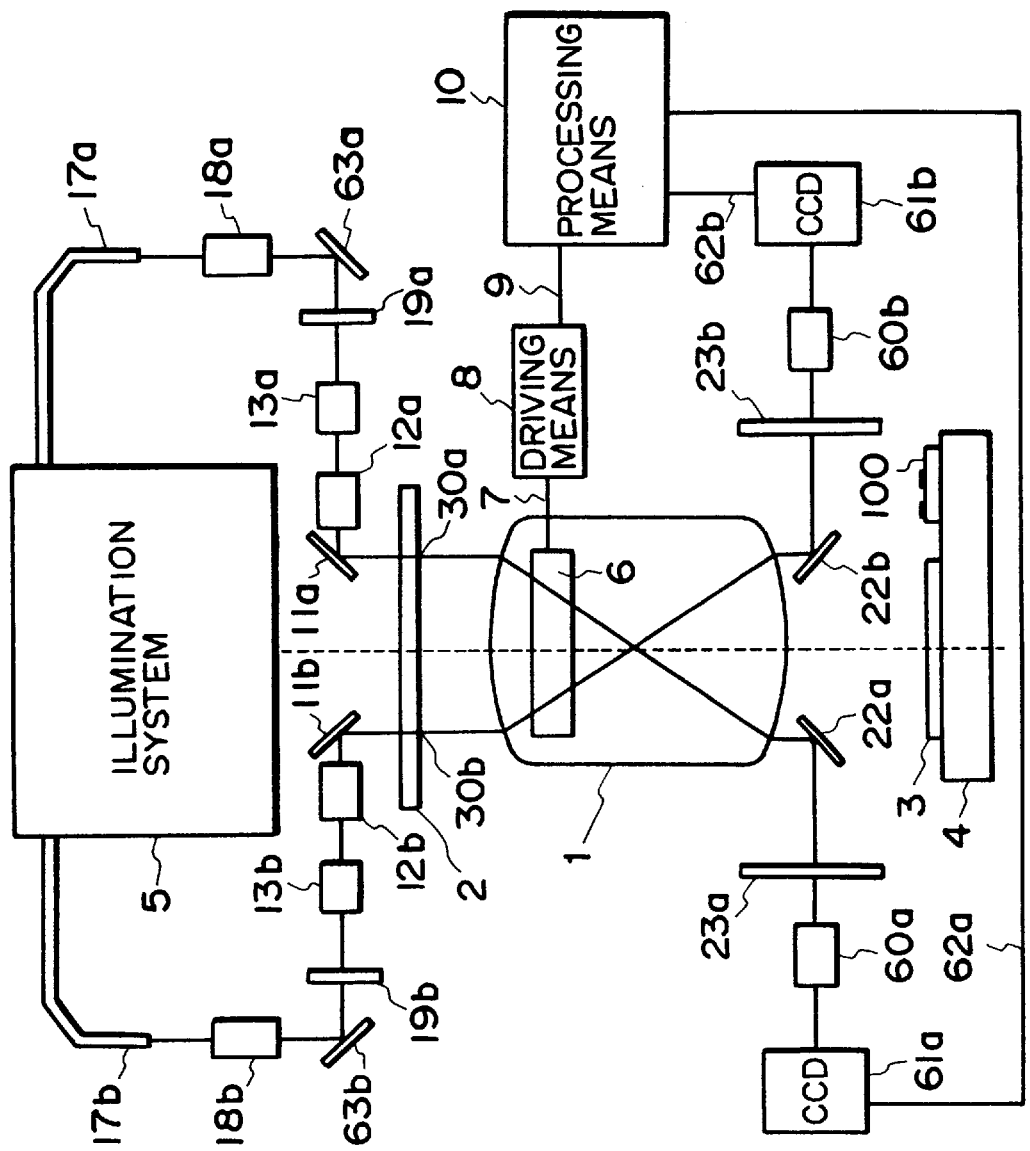
FIG. 8 is a schematic view of a main portion of a projection exposure apparatus according to a third embodiment of the present invention.

FIG. 8 is a schematic view of a main portion of a projection exposure apparatus according to a third embodiment of the present invention. This embodiment differs from the preceding embodiment in that a microscope reference mark 19 and a lens monitoring reference mark 23 are transmissively illuminated and that images of these marks are imaged upon a photoelectric conversion surface of a CCD camera 61 which is placed on the wafer side of the projection lens 1. The remaining portion has essentially the same structure. The components of this embodiment corresponding to those shown in FIG. 1 or 7 are denoted by similar reference numerals.

In FIG. 8, an electronic circuit pattern formed on a reticle 2 is lithographically transferred onto a wafer 3, by exposure light projected from an exposure illumination system 5 and through a projection lens 1.

The reticle 2 is placed on a reticle stage, not shown. The reticle stage is provided with a reticle reference mark (not shown) to be used for setting the reticle 2 with respect to the major assembly of the projection exposure apparatus.

The projection lens 1 has a correcting mechanism 6 contained therein, for changing the optical characteristic of the projection lens 1. The correcting mechanism 6 is operable in response to a signal supplied from a driving circuit 8 through a communication line 7. The driving circuit 8 receives a signal from a processing means 10 through a line 9, representing the amount of drive for the correcting mechanism 6.

A wafer 3 is placed on an X-Y-Z-θ stage 4 through a wafer chuck (not shown). A fiduciary mark 100 is provided on the X-Y-Z-θ stage 4.

Disposed between the reticle 2 and the exposure illumination system 5 are observation optical systems for observation of the mark 23 through the projection lens 1 and by means of the CCD camera 61, like the preceding embodiment and as shown in FIG. 3. Denoted at 11 (11a–11d) are mirrors for reflecting light toward the reticle 2. Denoted at 12 (12a–12d) are objective lenses. The optical arrangement after the objective lens 12 is omitted in FIG. 3.

As shown in FIG. 3, there are four observation optical systems disposed above the reticle 2. While this embodiment uses four observation optical systems, any plural number may be adopted. In FIG. 3, denoted at EF is the exposure field provided by the projection lens 1, and denoted at P is the range of an electronic circuit pattern formed on the reticle 2. The observation optical systems have their optical components disposed so as not to interfere with the exposure illumination light as the pattern in the range P is transferred to the wafer 3.

Next, as in the case of the preceding embodiments, a description will be made of one observation optical system which is on the right-hand side of FIG. 8. A portion of exposure light from the exposure illumination system 5 is guided by a light guide 17a into a microscope illumination optical system 18a. The light is then reflected by a mirror 63a and it transmissively illuminates the microscope reference mark 19a. The microscope reference mark 19a comprises a pattern which corresponds to dark-and-bright inversion of the pattern of FIG. 5 in the first embodiment. Namely, in the first embodiment, the pattern of FIG. 5 comprises a light transmissive area, whereas in this embodiment the mark portion is defined by a light blocking material.

After passing through the microscope reference mark 19a, the light goes through a relay lens 13a and an objective lens 12a. Subsequently, the light passes through the reticle 2. Here, the light goes through a transmission window 30a formed on the reticle 2. This transmission window 30a is disposed in accordance with the position of the observation optical system, such as shown in FIG. 2. The position of the window is out of the electronic circuit pattern range P to avoid physical interference with the circuit pattern P. such that there is no restriction produced in relation to the circuit pattern P.

The light passing through the transmission window 30a of the reticle 2 goes through the projection lens 1 and it impinges on the mirror 22a. The light is reflected by the mirror 22a, and then it forms an image of the microscope reference mark 19a upon the lens monitoring reference mark 23a. Here, these marks are disposed so as to avoid mutual overlapping of the microscope reference mark pattern 19a and the lens monitoring reference mark pattern 23a. The lens monitoring reference mark 23a comprises the same pattern as shown in FIG. 4 of the first embodiment.

Subsequently, the light passes through the lens monitoring reference mark 23a and, after passing through the lens monitoring reference mark observation optical system 60a, the light forms an image 23a2 of the lens monitoring reference mark and an image 19a2 of the microscope reference mark upon the photoelectric converting device of the CCD camera 61a. Thus, upon the photoelectric conversion surface of the CCD camera 61a, two images, that is, the image of the lens monitoring reference mark 23a and the image of the microscope reference mark image 19a are imaged, such as shown in FIG. 6. Namely, the photoelectric conversion surface of the CCD camera 61a is in an optically conjugate relation with the lens monitoring reference mark 23a and the microscope reference mark 19a.

In this embodiment, since the lens monitoring reference mark image 23a 2 and the microscope reference mark image 19a2 as imaged upon the photoelectric conversion surface of the CCD camera 16a are those images having been formed on the basis of transmissive illumination, they have a high contrast.

As shown in FIG. 6, the image as transformed into an electrical signal at the photoelectric conversion surface of the CCD camera 16a is transmitted to the processing means 10 through a line 24a. Within the processing means 10, mark position measurement is performed by using a window 42 (FIG. 6) for the lens monitoring reference mark 23a and by using windows 41 and 43 for the microscope reference mark 19a. Then, the processing means 10 calculates a deviation between the marks, on the basis of the positions of the images of the marks 23a and 19a upon the photoelectric conversion surface.

The measurement and calculation operation described above is performed with respect to each of at least two (four in this embodiment) observation optical systems. Then, from the detected deviations, the magnification of the projection lens 1, for example, is calculated. The resultant value of the calculation is stored into a memory (not shown) within the processing means 10, together with the time of the calculation. Further, the measurement and calculation operation described above is repeated at a certain time interval (i.e., periodically) or it is repeated successively. The processing means 10 calculates a difference between a resultant value obtained by an earlier calculation and a resultant value obtained by a later calculation, more specifically, the difference between the value as calculated on the basis of the measurement and calculation operation made at a certain moment and the value as calculated on the basis of the measurement and calculation operation performed later than the certain moment. The thus calculated difference is compared and discriminated by comparing/discriminating means (not shown) within the processing means 10.

The processing means 10 is provided with a driving information table which concerns how the correcting mechanism 6 within the projection lens 1 should be actuated to correct a change in optical characteristic of the projection lens 1, with respect to the above-described difference. Thus, in accordance with the difference detected, the driving amount for the correcting mechanism 6 is outputted to the driving circuit (driving means) 8 through a line 9. In response, the driving circuit 8 drives the correcting mechanism 6 through a line 7, whereby the optical characteristic of the projection lens 1 is corrected. The correcting mechanism 6 operates, for example, to move a predetermined lens or lenses of the component lenses of the projection lens 1 along the optical axis direction or to produce eccentricity therein, to thereby change the optical characteristic.

In this embodiment, the measurement of deviation as well as the correction of the optical characteristic described above can be executed independently of the operational state of the projection exposure apparatus. Namely, even during execution of an exposure operation for an actual device wafer, any change in optical characteristic of the projection lens 1 can be monitored and corrected continuously without applying influence to the exposure process. Thus, a higher throughput is attainable.

Embodiment 4

Figure 9:
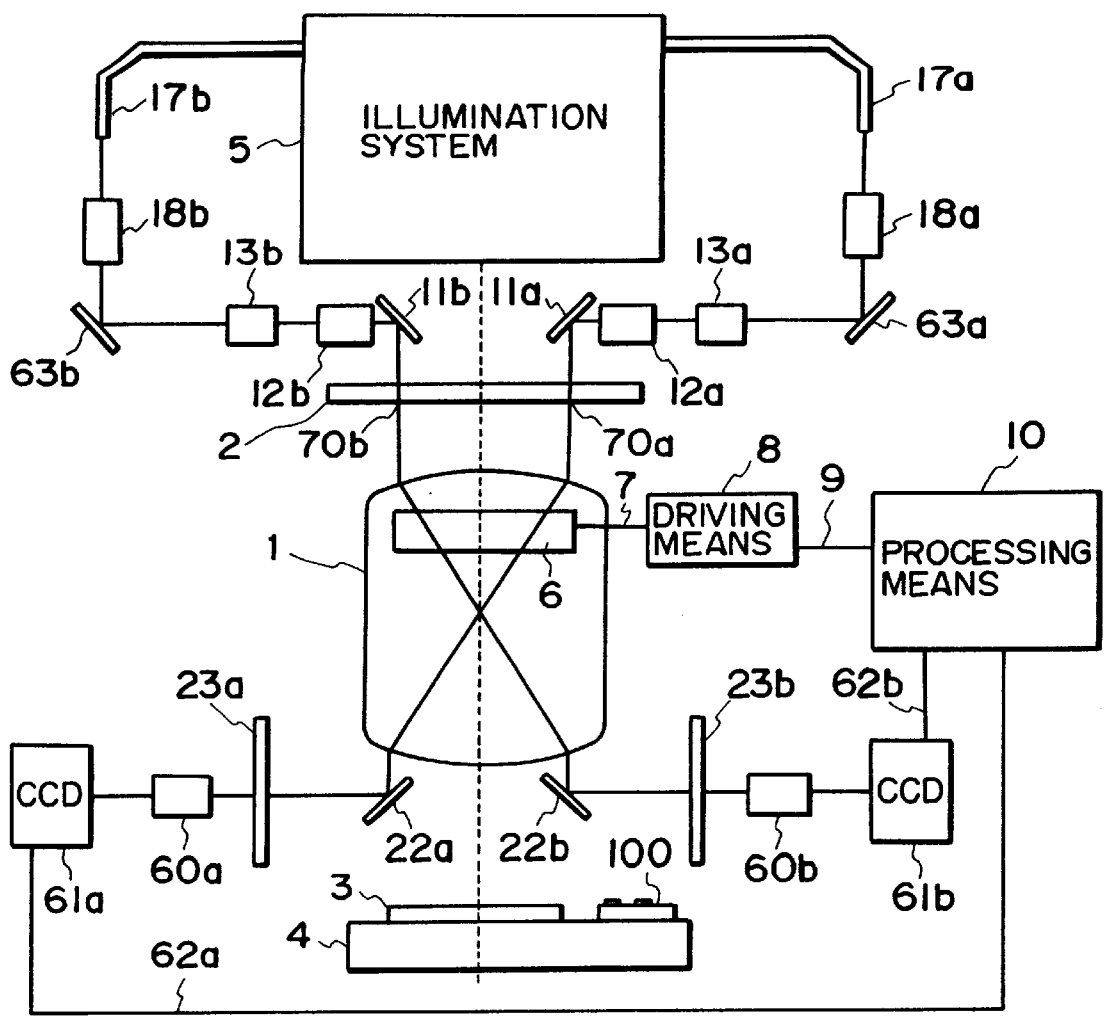
FIG. 9 is a-schematic view of a main portion of a projection exposure apparatus according to a fourth embodiment of the present invention.

FIG. 9 is a schematic view of a main portion of a projection exposure apparatus according to a fourth embodiment of the present invention. This embodiment differs from the third embodiment of FIG. 8 in that no microscope reference mark 19 is provided in the microscope and, in place of it, a reference mark 70 is provided on a reticle 2, and in that a change in deviation between this mark and a lens monitoring reference mark 23 is detected, for monitoring the state of the lens. The remaining portion has essentially the same structure. Particularly, since, in this embodiment, a change in distortion and magnification can be monitored directly through the reticle 2, the correction precision is better than that of the first to third embodiments. In FIG. 9, the components corresponding to those of the first to third embodiments are denoted by similar reference numerals.

In FIG. 9, an electronic circuit pattern formed on a reticle 2 is lithographically transferred onto a wafer 3, by exposure light projected from an exposure illumination system 5 and through a projection lens 1.

The reticle 2 is placed on a reticle stage, not shown. The reticle stage is provided with a reticle reference mark (not shown) to be used for setting the reticle 2 with respect to the major assembly of the projection exposure apparatus.

The projection lens 1 has a correcting mechanism 6 contained therein, for changing the optical characteristic of the projection lens 1. The correcting mechanism 6 is operable in response to a signal supplied from a driving circuit 8 through a communication line 7. The driving circuit 8 receives a signal from a processing means 10 through a line 9, representing the amount of drive for the correcting mechanism 6.

A wafer 3 is placed on an X-Y-Z-θ stage 4 through a wafer chuck (not shown). A fiduciary mark 100 is provided on the X-Y-Z-θ stage 4.

Disposed between the reticle 2 and the exposure illumination system 5 are observation optical systems for observation of a mark through the projection lens 1 and by means of the CCD camera 61, like the preceding embodiment and as shown in FIG. 3. Denoted at 11 (11a–11d) are mirrors for reflecting light toward the reticle 2. Denoted at 12 (12a–12d) are objective lenses. The optical arrangement after the objective lens 12 is omitted in FIG. 3.

As shown in FIG. 3, there are four observation optical systems disposed above the reticle 2. While this embodiment uses four observation optical systems, any plural number may be adopted. In FIG. 3, denoted at EF is the exposure field provided by the projection lens 1, and denoted at P is the range of an electronic circuit pattern formed on the reticle 2. The observation optical systems have their optical components disposed so as not to interfere with the exposure illumination light as the pattern in the range P is transferred to the wafer 3.

Next, a description will be made of one observation optical system which is on the right-hand side of FIG. 9. A portion of exposure light from the exposure illumination system 5 is guided by a light guide 17a into a microscope illumination optical system 18a. The light is then reflected by a mirror 63a and, after passing through a relay lens 13a and an objective lens 12a, it is reflected by a mirror 11a to illuminate a mark portion 70a on the reticle 2.

Figure 10:
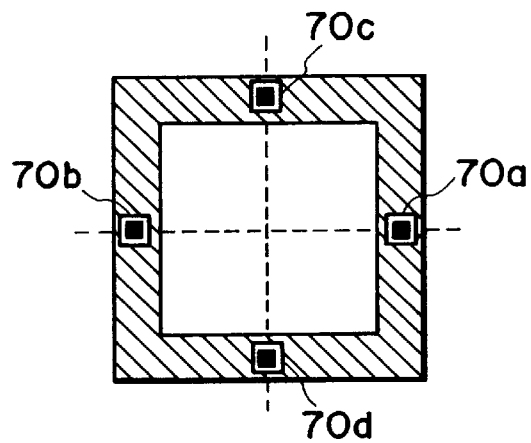
FIG. 10 is a schematic view for explaining placement of a mark upon a reticle usable in the fourth embodiment of the present invention.

As shown in FIG. 10, marks 70a–70d are formed on the pattern bearing surface of the reticle 2, at positions on the paths of illumination light. These marks 70 are so formed that the mark portion thereof is provided by a light blocking material, such as shown in FIG. 4. The positions of these marks are out of the electronic circuit pattern range to avoid physical interference with the circuit pattern, such that there is no restriction produced in relation to the circuit pattern.

The light passing through the mark 70a of the reticle 2 goes through the projection lens 1 and it impinges on the mirror 22a. The light is reflected by the mirror 22a, and then it forms an image of the mark 70a upon the lens monitoring reference mark 23a. Here, these marks are disposed so as to avoid mutual overlapping of the microscope reference mark 70a and the lens monitoring reference mark 23a. The lens monitoring reference mark 23a comprises the same pattern as shown in FIG. 4 of the first embodiment.

Subsequently, the light passes through the lens monitoring reference mark 23a and, after passing through the lens monitoring reference mark observation optical system 60a, the light forms an image of the Lens monitoring reference mark 23a and an image of the mark 70a upon the photoelectric converting device of the CCD camera 61a. Thus, upon the photoelectric conversion surface of the CCD camera 61a, two images, that is, the lens monitoring reference mark image 23a2 and the image of the mark 70a (in place of the microscope reference mark image 19a) are imaged, such as shown in FIG. 6. Namely, the photoelectric conversion surface of the CCD camera 61a is in an optically conjugate relation with the lens monitoring reference mark 23a and the mark 70a on the reticle 2.

In this embodiment, since the lens monitoring reference mark image 23a 2 and the image of the mark 70a of the reticle 2 as imaged upon the photoelectric conversion surface of the CCD camera 61a are those images having been formed on the basis of transmissive illumination, they have a high contrast.

As shown in FIG. 6, the image as transformed into an electrical signal at the photoelectric conversion surface of the CCD camera 16a is transmitted to the processing means 10 through a line 24a. Within the processing means 10, mark position measurement is performed by using a window 42 (FIG. 6) for the lens monitoring reference mark 23a and by using windows 41 and 43 for the mark 70a of the reticle 2. Then, the processing means 10 calculates a deviation between the marks, on the basis of the positions of the images of the marks 23a and 70a upon the photoelectric conversion surface.

The measurement and calculation operation described above is performed with respect to each of at least two (four in this embodiment) observation optical systems. Then, from the detected deviations, the magnification of the projection lens 1, for example, is calculated. The resultant value of the calculation is stored into a memory (not shown) within the processing means 10, together with the time of the calculation. Further, the measurement and calculation operation described above is repeated at a certain time interval (i.e., periodically) or it is repeated successively. The processing means 10 calculates a difference between a resultant value obtained by an earlier calculation and a resultant value obtained by a later calculation, more specifically, the difference between the value as calculated on the basis of the measurement and calculation operation made at a certain moment and the value as calculated on the basis of the measurement and calculation operation performed later than the certain moment. The thus calculated difference is compared and discriminated by comparing/discriminating means (not shown) within the processing means 10.

The processing means 10 is provided with a driving information table which concerns how the correcting mechanism 6 within the projection lens 1 should be actuated to correct a change in optical characteristic of the projection lens 1, with respect to the above-described difference. Thus, in accordance with the difference detected, the driving amount for the correcting mechanism 6 is outputted to the driving circuit (driving means) 8 through a line 9. In response, the driving circuit 8 drives the correcting mechanism 6 through a line 7, whereby the optical characteristic of the projection lens 1 is corrected. The correcting mechanism 6 operates, for example, to move a predetermined lens or lenses of the component lenses of the projection lens 1 along the optical axis direction or to produce eccentricity therein, to thereby change the optical characteristic.

In this embodiment, the measurement of deviation as well as the correction of the optical characteristic described above can be executed independently of the operational state of the projection exposure apparatus. Namely, even during execution of an exposure operation for an actual device wafer, any change in optical characteristic of the projection lens 1 can be monitored and corrected continuously without applying influence to the exposure process. Thus, a higher throughput is attainable.

Embodiment 5

Figure 11:
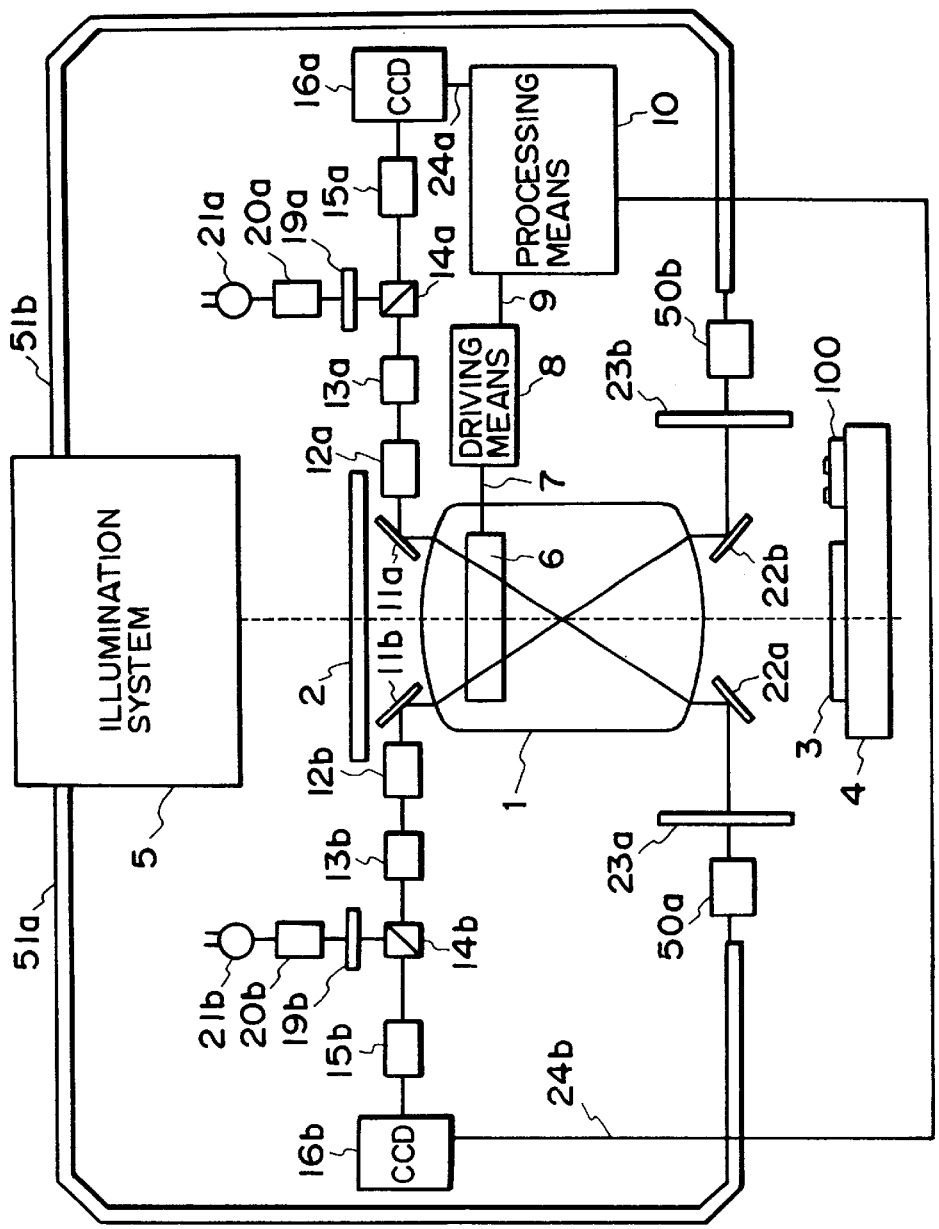
FIG. 11 is a schematic view of a main portion of a projection exposure apparatus according to a fifth embodiment of the present invention.

FIG. 11 is a schematic view of a main portion of a projection exposure apparatus according to a fifth embodiment of the present invention. This embodiment differs from the second embodiment of FIG. 7 in that a microscope is disposed between a reticle 2 and a projection lens 1. The remaining portion has essentially the same structure.

This embodiment has advantages in that, since no monitoring light passes through the reticle 2, there is no necessity of forming a window in the reticle 2 for passing the monitoring light, and in that there is no limitation to the object-to-image distance because of no necessity of transmission of light through the reticle, which leads to enlargement of latitude in the design.

In FIG. 11, the components corresponding to those of the first to fourth embodiments are denoted by similar reference numerals.

In FIG. 11, an electronic circuit pattern formed on a reticle 2 is lithographically transferred onto a wafer 3, by exposure light projected from an exposure illumination system 5 and through a projection lens 1.

The reticle 2 is placed on a reticle stage, not shown. The reticle stage is provided with a reticle reference mark (not shown) to be used for setting the reticle 2 with respect to the major assembly of the projection exposure apparatus.

The projection lens 1 has a correcting mechanism 6 contained therein, for changing the optical characteristic of the projection lens 1. The correcting mechanism 6 is operable in response to a signal supplied from a driving circuit 8 through a communication line 7. The driving circuit 8 receives a signal from a processing means 10 through a line 9, representing the amount of drive for the correcting mechanism 6.

A wafer 3 is placed on an X-Y-Z-θ stage 4 through a wafer chuck (not shown). A fiduciary mark 100 is provided on the X-Y-Z-θ stage 4.

Disposed between the reticle 2 and the exposure illumination system 5 are observation optical systems for observation of marks 23 through the projection lens 1. Like the first to fourth embodiments, this embodiment uses plural microscopes (not shown).

Next, a description will be made of one observation optical system which is on the right-hand side of FIG. 11. A portion of exposure light from the exposure illumination system 5 is guided by a light guide 51a into a lens monitoring reference mark illumination optical system 50a. The thus projected light transmissively illuminates a lens monitoring reference mark 23a. The lens monitoring reference mark 23a comprises a pattern which corresponds to dark-and-bright inversion of the pattern of FIG. 4 in the first embodiment. Namely, in the first embodiment the pattern of FIG. 4 comprises a light blocking material (reflective member), whereas in this embodiment, the mark portion is defined by a transmissive area and the portion other than the mark portion is provided by a light blocking material.

After passing through the lens monitoring reference mark 23a, the light is reflected by a mirror 22a toward the projection lens 1. Subsequently, the light passes through the projection lens 1 and then it impinges on a mirror 11a of the projection optical system. The light reflected by the mirror 11a goes through an objective lens 12a and a relay lens 13a, and, after this, it passes through a beam splitter 14a. Subsequently, the light goes through an erector lens 15a, and it forms an image 23a2 of the lens monitoring reference mark 23a upon a photoelectric converting device of a CCD camera 16a.

On the other hand, a light source 21a produces light of a wavelength different from the exposure light, and this light goes through a microscope reference mark illuminating optical system 20a. Then, the light transmissively illuminates a microscope reference mark (second mark) 19a. As shown in FIG. 5, the microscope reference mark 19a is provided on a substrate by using a light blocking material such as Cr, for example. While, in this embodiment, the illumination light for the microscope reference mark 19a has a wavelength different from the exposure light, the same wavelength may be used.

The light passing through the microscope reference mark 19a is reflected by the beam splitter 14a and, after passing through the erector lens 15a, it forms an image 19a2 of the microscope reference mark 19a upon the photoelectric converting device of the CCD camera 16a. Thus, upon the photoelectric conversion surface of the CCD camera 16a, two images, that is, the lens monitoring reference mark 23a and the microscope reference mark 19a are imaged, such as shown in FIG. 6. Namely, the photoelectric conversion surface of the CCD camera 16a is in an optically conjugate relation with the lens monitoring reference mark 23a and the microscope reference mark 19a.

In this embodiment, since the lens monitoring reference mark image 23a2 and the microscope reference mark image 19a2 as imaged upon the photoelectric conversion surface of the CCD camera 16a are those images having been formed on the basis of transmissive illumination, they have a high contrast.

As shown in FIG. 6, the image as transformed into an electrical signal at the photoelectric conversion surface of the CCD camera 16a is transmitted to the processing means 10 through a line 24a. Within the processing means 10, mark position measurement is performed by using a window 42 (FIG. 6) for the lens monitoring reference mark 23a and by using windows 41 and 43 for the microscope reference mark 19a. Then, the processing means 10 calculates a deviation between the marks, on the basis of the positions of the images of the marks 23a and 19a upon the photoelectric conversion surface.

The measurement and calculation operation described above is performed with respect to each of at least two (four in this embodiment) observation optical systems. Then, from the detected deviations, the magnification of the projection lens 1, for example, is calculated. The resultant value of the calculation is stored into a memory (not shown) within the processing means 10, together with the time of the calculation. Further, the measurement and calculation operation described above is repeated at a certain time interval (i.e., periodically) or it is repeated successively. The processing means 10 calculates a difference between a resultant value obtained by an earlier calculation and a resultant value obtained by a later calculation, more specifically, the difference between the value as calculated on the basis of the measurement and calculation operation made at a certain moment and the value as calculated on the basis of the measurement and calculation operation performed later than the certain moment. The thus calculated difference is compared and discriminated by comparing/discriminating means (not shown) within the processing means 10.

The processing means 10 is provided with a driving information table which concerns how the correcting mechanism 6 within the projection lens 1 should be actuated to correct a change in optical characteristic of the projection lens 1, with respect to the above-described difference. Thus, in accordance with the difference detected, the driving amount for the correcting mechanism 6 is outputted to the driving circuit (driving means) 8 through a line 9. In response, the driving circuit 8 drives the correcting mechanism 6 through a line 7, whereby the optical characteristic of the projection lens 1 is corrected. The correcting mechanism 6 operates, for example, to move a predetermined lens or lenses of the component lenses of the projection lens 1 along the optical axis direction or to produce eccentricity therein, to thereby change the optical characteristic.

In this embodiment, the measurement of deviation as well as the correction of the optical characteristic described above can be executed independently of the operational state of the projection exposure apparatus. Namely, even during execution of an exposure operation for an actual device wafer, any change in optical characteristic of the projection lens 1 can be monitored and corrected continuously without applying influence to the exposure process. Thus, a higher throughput is attainable.

Embodiment 6

Figure 12:
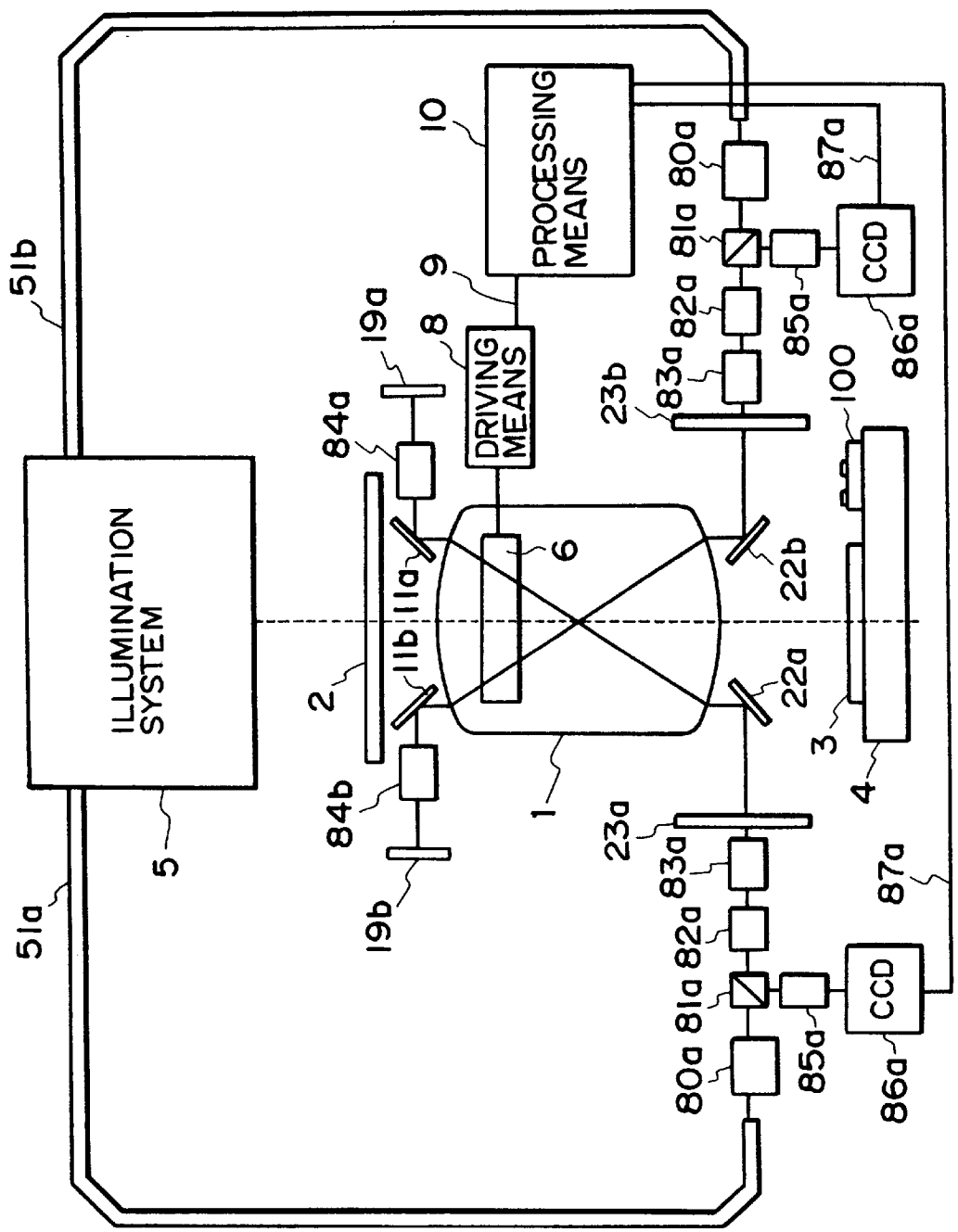
FIG. 12 is a schematic view of a main portion of a projection exposure apparatus according to a sixth embodiment of the present invention.

FIG. 12 is a schematic view of a main portion of a projection exposure apparatus according to a sixth embodiment of the present invention. This embodiment differs from the first embodiment of FIG. 1 in that: in the first embodiment, the illumination light is projected from the reticle 2 side of the projection lens 1 and the light reflected by the lens monitoring reference mark 23 is detected on the reticle 2 side; whereas, in this embodiment, the illumination light is projected from the lens monitoring reference mark 23 side and the light reflected by a reference mark 19, corresponding to a microscope reference mark, is detected with use of a microscope which is provided below the projection lens 1. Also, in this embodiment, above the projection lens 1, there is a chromatic aberration correcting optical system 84 which is disposed between the reticle 2 and the projection lens 1. The remaining portion has essentially the same structure. In FIG. 12, the components corresponding to those of the first to fifth embodiments are denoted by similar reference numerals.

In FIG. 12, an electronic circuit pattern formed on a reticle 2 is lithographically transferred onto a wafer 3, by exposure light projected from an exposure illumination system 5 and through a projection lens 1.

The reticle 2 is placed on a reticle stage, not shown. The reticle stage is provided with a reticle reference mark (not shown) to be used for setting the reticle 2 with respect to the major assembly of the projection exposure apparatus.

The projection lens 1 has a correcting mechanism 6 contained therein, for changing the optical characteristic of the projection lens 1. The correcting mechanism 6 is operable in response to a signal supplied from a driving circuit 8 through a communication line 7. The driving circuit 8 receives a signal from a processing means 10 through a line 9, representing the amount of drive for the correcting mechanism 6.

A wafer 3 is placed on an X-Y-Z-θ stage 4 through a wafer chuck (not shown). A fiduciary mark 100 is provided on the X-Y-Z-θ stage 4.

Disposed between the reticle 2 and the projection lens 1 are a plurality of chromatic aberration correcting optical systems 84 (only two of them are illustrated) through which the light passes when marks 19 are to be observed from the wafer side and through the projection lens 1.

Next, a description will be made of one observation optical system which is on the right-hand side of FIG. 12. A portion of exposure light from the exposure illumination system 5 is guided by a light guide 51a into a microscope illumination optical system 80a. The thus projected light passes through a beam splitter 81a and, after subsequently passing through a relay lens 82a and an objective lens 83a, it transmissively illuminates a lens monitoring reference mark 23a. The lens monitoring reference mark 23a comprises a pattern such as shown in FIG. 4 of the first embodiment. Namely, the pattern of FIG. 4 comprises a light blocking material (reflective member), and the portion other than the mark portion is transparent.

After passing through the lens monitoring reference mark 23a, the light is reflected by a mirror 22a toward the projection lens 1. Subsequently, the light passes through the projection lens 1 and then it impinges on a mirror 11a. The light is reflected by the mirror 11a, and then it goes through a chromatic aberration correcting optical system 84a. After this, the light forms an image of the lens monitoring reference mark upon the reference mark 19a. As shown in FIG. 5, the reference mark 19a is provided on a substrate by forming the portion other than the mark portion by use of a light blocking material such as Cr, for example.

The light reflected by the reference mark 19a goes through the chromatic aberration correcting optical system 84a, and then it is reflected by the mirror 11a. Subsequently, it goes through the projection lens 1 and then it is reflected by a mirror 22a. Then, it passes through an objective lens 83a and a relay lens 82a, and it is reflected by the beam splitter 81a. Subsequently, the light goes through an erector lens 85a and, then, it forms an image 23a2 of the lens monitoring reference mark 23a and an image 19a2 of the reference mark 19a, upon a photoelectric converting device of a CCD camera 86a.

Thus, upon the photoelectric conversion surface of the CCD camera 86a, two images, that is, the lens monitoring reference mark 23a and the microscope reference mark 19a are imaged, such as shown in FIG. 6. Namely, the photoelectric conversion surface of the CCD camera 86a is in an optically conjugate relation with the lens monitoring reference mark 23a and the reference mark 19a.

As shown in FIG. 6, the image as transformed into an electrical signal at the photoelectric conversion surface of the CCD camera 16a is transmitted to the processing means 10 through a line 87a. Within the processing means 10, mark position measurement is performed by using a window 42 (FIG. 6) for the lens monitoring reference mark 23a and by using windows 41 and 43 for the microscope reference mark 19a. Then, the processing means 10 calculates a deviation between the marks, on the basis of the positions of the images of the marks 23a and 19a upon the photoelectric conversion surface.

The measurement and calculation operation described above is performed with respect to each of at least two (four in this embodiment) observation optical systems. Then, from the detected deviations, the magnification of the projection lens 1, for example, is calculated. The resultant value of the calculation is stored into a memory (not shown) within the processing means 10, together with the time of the calculation. Further, the measurement and calculation operation described above is repeated at a certain time interval (i.e., periodically) or it is repeated successively. The processing means 10 calculates a difference between a resultant value obtained by an earlier calculation and a resultant value obtained by a later calculation, more specifically, the difference between the value as calculated on the basis of the measurement and calculation operation made at a certain moment and the value as calculated on the basis of the measurement and calculation operation performed later than the certain moment. The thus calculated difference is compared and discriminated by comparing/discriminating means (not shown) within the processing means 10.

The processing means 10 is provided with a driving information table which concerns how the correcting mechanism 6 within the projection lens 1 should be actuated to correct a change in optical characteristic of the projection lens 1, with respect to the above-described difference. Thus, in accordance with the difference detected, the driving amount for the correcting mechanism 6 is outputted to the driving circuit (driving means) 8 through a line 9. In response, the driving circuit 8 drives the correcting mechanism 6 through a line 7, whereby the optical characteristic of the projection lens 1 is corrected. The correcting mechanism 6 operates, for example, to move a predetermined lens or lenses of the component lenses of the projection lens 1 along the optical axis direction or to produce eccentricity therein, to thereby change the optical characteristic.

In this embodiment, the measurement of deviation as well as the correction of the optical characteristic described above can be executed independently of the operational state of the projection exposure apparatus. Namely, even during execution of an exposure operation for an actual device wafer, any change in optical characteristic of the projection lens 1 can be monitored and corrected continuously without applying influence to the exposure process. Thus, a higher throughput is attainable.

Embodiment 7

Figure 13:
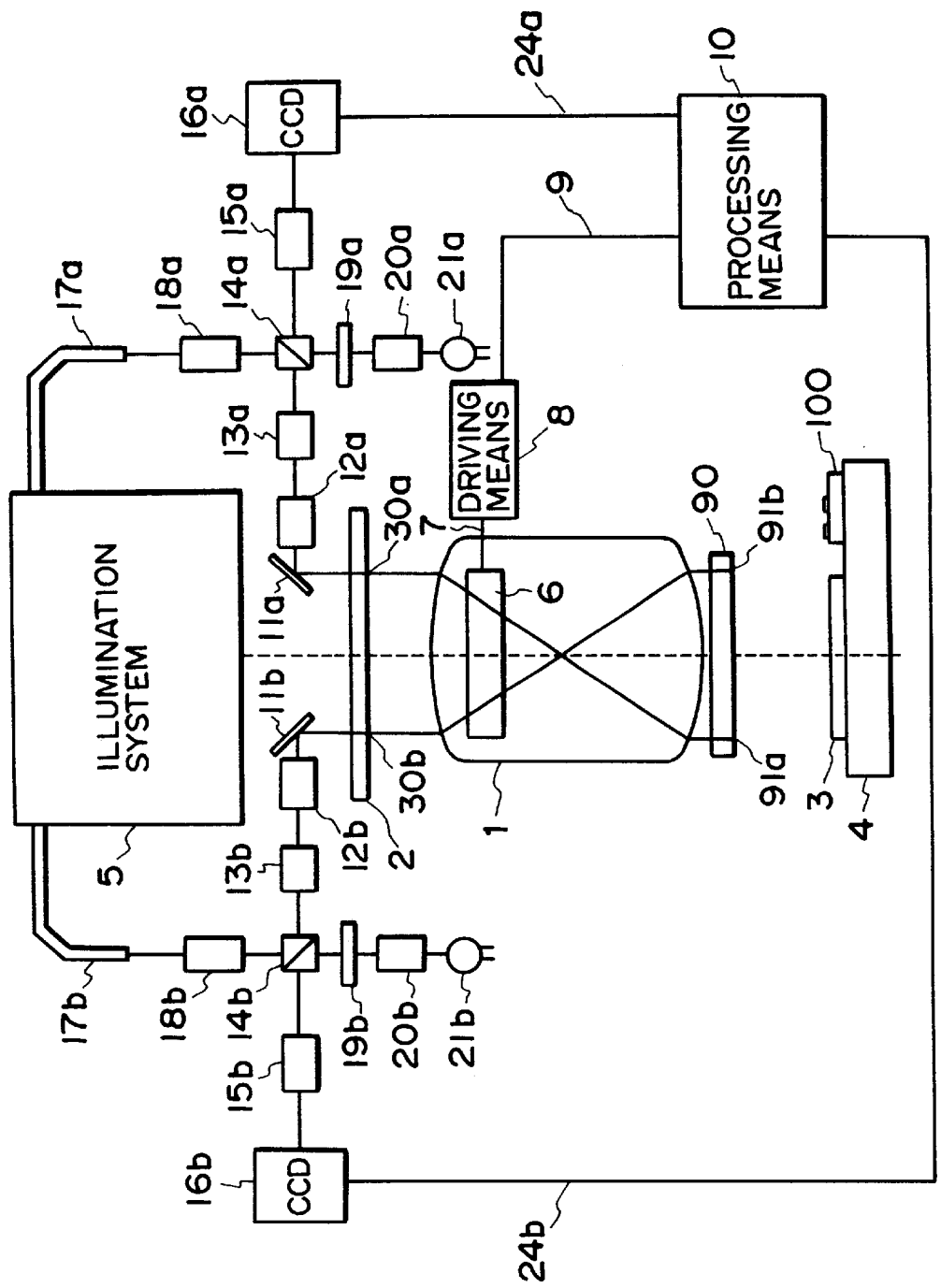
FIG. 13 is a schematic view of a main portion of a projection exposure apparatus according to a seventh embodiment of the present invention.

FIG. 13 is a schematic view of a main portion of a projection exposure apparatus according to a seventh embodiment of the p resent invention. This embodiment differs from the first embodiment in that a transparent parallel flat plate 90 is disposed below the projection lens 1 and lens monitoring reference marks 91 are provided on its wafer side surface. The remaining portion has essentially the same structure as that of the first embodiment.

In this embodiment, as described, no complicated optical arrangement is disposed below the projection lens 1, by which the whole structure is made quite simple. The transparent parallel flat plate 90 disposed below the projection lens 1 serves to adjust eccentric coma of the projection lens 1 by tilting the plate 90 itself. The structure and function of the remaining portion are substantially the same as those of the first embodiment .

Embodiment 8

Figure 14:
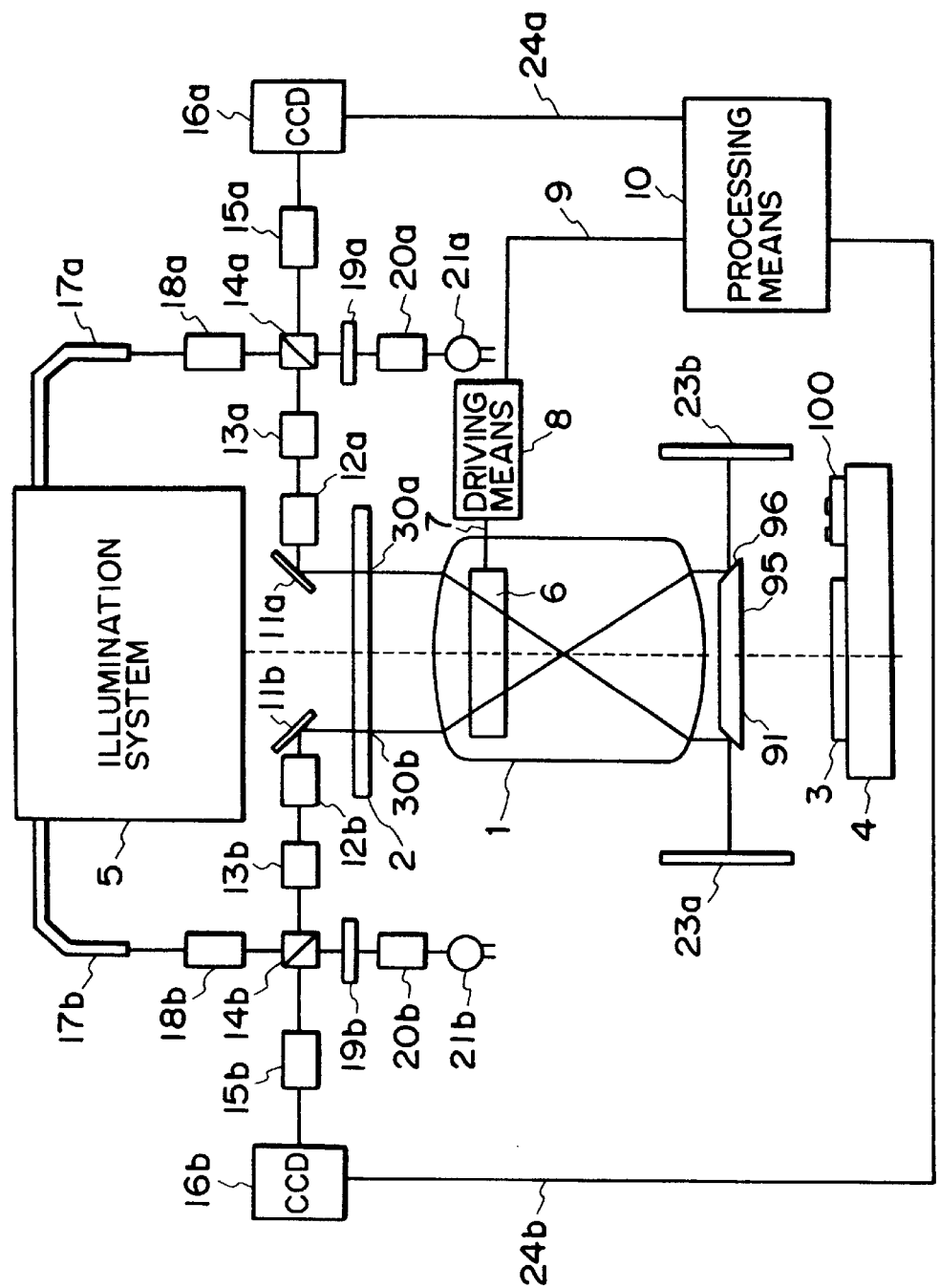
FIG. 14 is a schematic view of a main portion of a projection exposure apparatus according to an eighth embodiment of the present invention.

FIG. 14 is a schematic view of a main portion of a projection exposure apparatus according to an eighth embodiment of the present invention. This embodiment differs from the seventh embodiment of FIG. 13 in that a transparent parallel flat plate 95 disposed below the projection lens 1 has its end faces formed into mirrors 96, as illustrated. The remaining portion has essentially the same structure as that of the seventh embodiment. The light reflected by the mirror 96 is deflected toward the lens monitoring reference mark 23.

The light reflected by the lens monitoring reference mark 23 goes back along its oncoming path toward a CCD camera 16. There is a lens monitoring reference mark 91 provided on the wafer 3 side surface. Since no complicated optical arrangement is disposed below the projection lens 1 as described above, the whole structure is made quite simple. The transparent parallel flat plate 95 disposed below the projection lens 1 serves to adjust eccentric coma of the projection lens 1 by tilting the plate 90 itself. The structure and function of the remaining portion are substantially the same as those of the first embodiment.

Embodiment 9

Next, a ninth embodiment of the present invention will be described. This embodiment differs from the first to eighth embodiments in that the observation optical systems (or observation illumination optical systems), used in the preceding embodiments for detection of a positional deviation, are used to monitor a change in best focus plane of the projection lens 1, for correction thereof. The remaining portion has essentially the same structure. Although this embodiment can be incorporated into any one of the first to eighth embodiments, a description will be made here of an example wherein it is applied to the first embodiment, in conjunction with FIG. 1.

A change in best focus plane of the projection lens 1 can be checked periodically, for example, during the interval of positional deviation measurement, in the manner to be described below. Of the lens monitoring reference mark 23 and the microscope reference mark 19 as imaged upon the photoelectric conversion surface of the CCD camera 16, the contrast (imagewise information) of such an image as being imaged through the projection lens 1, that is, the image of the lens monitoring reference mark 23, is calculated at the same time as the image is taken for the positional deviation measurement.

When the contrast value changes by a predetermined amount, the relay lens 13 is moved stepwise in the focus direction, sequentially by several steps. At each stepped position of the relay lens, an image is picked up. The contrast values of the thus picked up images are calculated. Then, from the relation between the focus position and contrast, the best focus position is calculated.

Here, if there occurs an offset due to a difference in numerical aperture (NA) between the observation optical system and the projection lens 1, a correction information table for correcting it may be prepared beforehand, and the best focus plane may be calculated on the basis of the table. When the amount of change of the best focus position thus calculated is beyond a predetermined amount set beforehand, the origin position of the X-Y-Z stage 4 may be shifted. This enables automatic correction of the best focus position of the projection lens 1.

The measurement and calculation operation described above may be made with reference to a single observation optical system. However, if it is made with reference to two or more observation optical systems, the correction precision will be improved due to an averaging effect. In this embodiment, as described, not only a change in aberration of the projection lens 1 but also a focus change thereof can be detected and corrected. Thus, high precision exposure performance is accomplished.

Embodiment of Device Manufacturing Method

Next, an embodiment of a device manufacturing method which uses a projection exposure apparatus such as described above, will be described.

Figure 17:
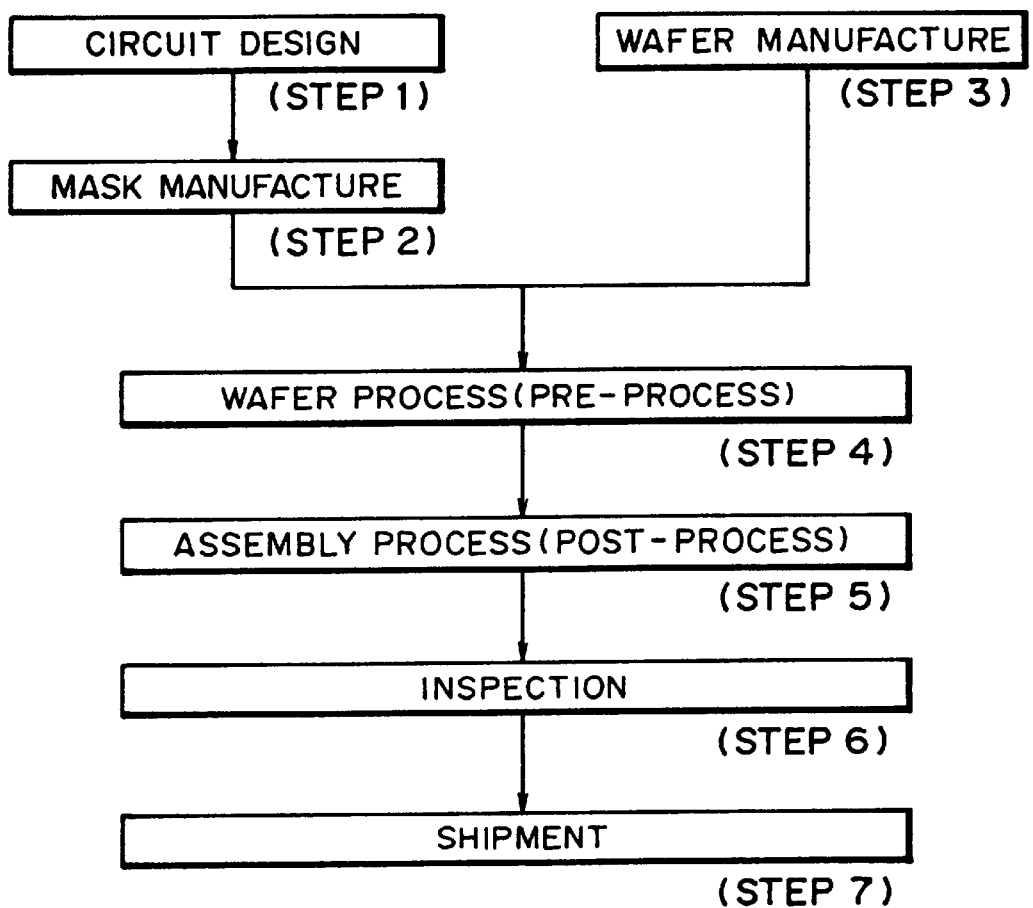
FIG. 17 is a flow chart of device manufacturing processes in accordance with an embodiment of the present invention.

FIG. 17 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 18:
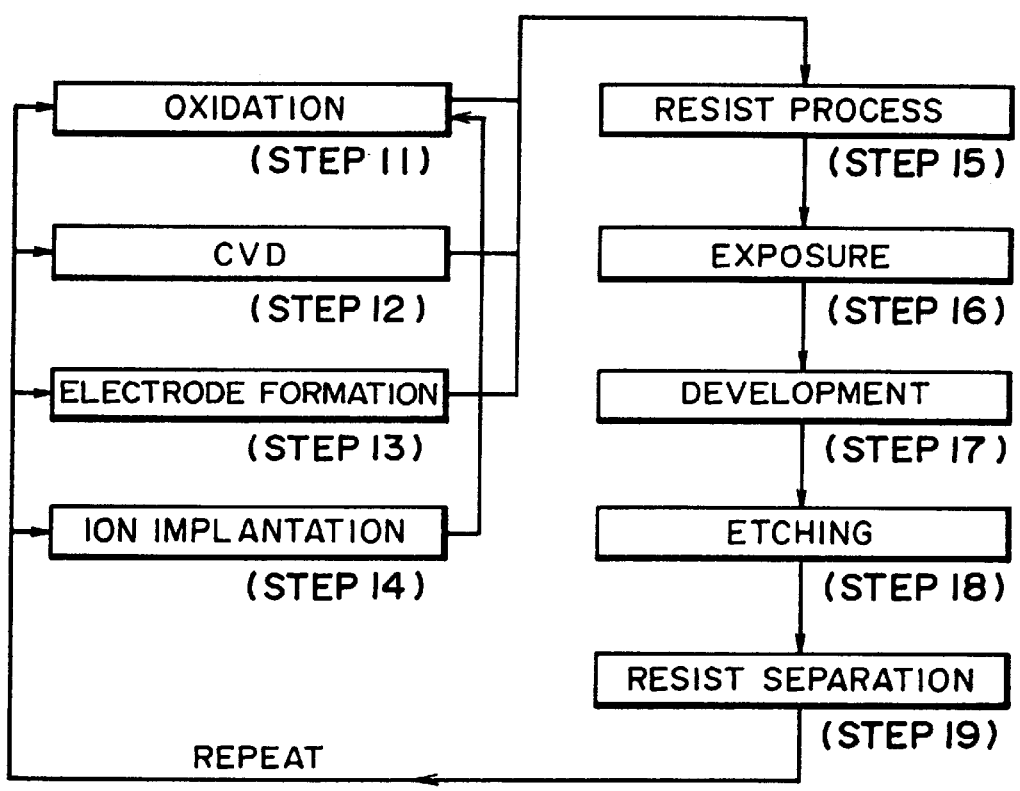
FIG. 18 is a flow chart of a wafer process in the procedure of the flow of FIG. 17.

FIG. 18 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:

a projection optical system for performing a projection exposure process by projecting a pattern of a first object onto a second object;

a correcting mechanism for changing an optical characteristic of said projection optical system;

positional information detecting means for detecting a relative positional relationship between first and second marks, which are disposed at different positions, wherein said positional information detecting means is operable during the projection exposure process and detects the first mark with the use of said projection optical system, and detects the second mark without the use of said projection optical system;

discriminating means operable, after the detection of the relative positional relationship by said positional information detecting means is repeated at a predetermined time interval or successively, to discriminate a relation between first positional information obtained as a result of detection of the first mark and second positional information obtained as a result of detection of the second mark made by said positional information detecting means; and actuating means for actuating said correcting mechanism on the basis of the discrimination made by said discriminating means, to change the optical characteristic of said projection optical system.

2. An apparatus according to claim 1, wherein said discriminating means performs the discrimination on the basis of a difference between the first positional information and the second positional information.

3. An apparatus according to claim 1, wherein said positional information detecting means detects the relative positional relationship between the first and second marks on the basis of photoelectric conversion of images of the first and second marks, respectively, as formed upon a photoelectric conversion surface of a photoelectric converting device.

4. An apparatus according to claim 1, wherein the first mark comprises a lens monitoring reference mark whose imaging position upon a predetermined plane is shiftable with the optical characteristic of said projection optical system, and wherein the second mark comprises a reference mark whose imaging position upon a photoelectric conversion surface of a photoelectric converting device is not shiftable.

5. An apparatus according to claim 1, wherein said positional information detecting means detects imagewise information about the first mark as defined on a photoelectric conversion surface of a photoelectric converting device to detect a change in an imaging plane of said projection optical system.

6. An apparatus according to claim 5, further comprising a stage for holding the second object, wherein said stage is moved in accordance with the change in imaging plane of said projection optical system as detected by said positional information detecting means.

7. A device manufacturing method, comprising the steps of:

projecting, with a projection optical system, a pattern of a first object onto a second object to perform a projection exposure process;

changing, with a correcting mechanism, an optical characteristic of the projection optical system;

detecting, with positional information detecting means, a relative positional relationship between first and second marks, which are disposed at different positions, wherein the positional information detecting means is operable during the projection exposure process and detects the first mark with the use of the projection optical system, and detects the second mark without the use of the projection optical system;

discriminating, by discriminating means, after the detection of the relative positional relationship by the positional information detecting means is repeated at a predetermined time interval or successively, a relation between first positional information obtained as a result of detection of the first mark and second positional information obtained as a result of detection of the second mark made by the positional information detecting means; and actuating, by actuating means, the correcting mechanism on the basis of the discrimination made by the discriminating means, to change the optical characteristic of the projection optical system;

transferring a pattern of a reticle onto a surface of a wafer through the projection optical system; and developing the wafer for production of a device.

8. A method according to claim 7, further comprising performing the discrimination, by the discriminating means, on the basis of a difference between the first positional information and the second positional information.

9. A method according to claim 7, further comprising detecting, by the positional information detecting means, the relative positional relationship between the first and second marks on the basis of photoelectric conversion of images of the first and second marks, respectively, as formed upon a photoelectric conversion surface of a photoelectric converting device.

10. A method according to claim 7, wherein the first mark comprises a lens monitoring reference mark whose imaging position upon a predetermined plane is shiftable with the optical characteristic of the projection optical system, and wherein the second mark comprises a reference mark whose imaging position upon a photoelectric conversion surface of a photoelectric converting device is not shiftable.

11. A method according to claim 7, further comprising detecting, by the positional information detecting means, imagewise information about the first mark as defined on a photoelectric conversion surface of a photoelectric converting device to detect a change in an imaging plane of the projection optical system.

12. A method according to claim 11, further comprising holding, with a stage, the second object, and moving the stage in accordance with the change in imaging plane of the projection optical system as detected by the positional information detecting means.

13. A projection exposure apparatus comprising:

a projection optical system for performing a projection exposure process by projecting a pattern of a first object onto a second object;

a correcting mechanism for changing an optical characteristic of said projection optical system;

positional information detecting means for detecting a relative positional relationship between first and second marks disposed at different positions, wherein said positional information detecting means is operable during the projection exposure process and detects the first mark with the use of said projection optical system, and detects the second mark without the use of said projection optical system;

discriminating means operable, after the detection of the relative positional relationship by said positional information detecting means is performed, to discriminate position detection information produced by said positional information detecting means; and actuating means for actuating said correcting mechanism on the basis of the discrimination made by said discriminating means, to change the optical characteristic of said projection optical system.

* * * * *

UNITED STATES PATENT AND TRADEMARK OFFICE
CERTIFICATE OF CORRECTION

PATENT NO.     : 6,233,042 B1
DATED          : May 15, 2001
INVENTOR(S)    : Tsuneo Kanda It is certified that error appears in the above-identified patent and that said Letters Patent is hereby corrected as shown below:

Column 3,
Line 55, "a-schematic" should read -- a schematic --.

Column 4,
Line 36, "system 1." should read -- system1). --

Column 5,
Line 22, "structural," should read -- structural --; and
Line 48, "Cr." should read -- Cr, --.

Column 7,
Line 20, "light" should read -- light. --; and
Line 34, "theses" should read -- these --.

Column 9,
Line 28, "and-the" should read -- and the --.

Column 11,
Line 25, "pattern P." should read -- pattern P, --.

Column 13,
Line 63, "Lens" should read -- lens --.

Column 14,
Line 7, "23a 2" should read -- 23a2 --.

Column 15,
Line 52, "embodiment" should read -- embodiment, --.

Column 19,
Line 33, "p resent" should read -- present --.

UNITED STATES PATENT AND TRADEMARK OFFICE
CERTIFICATE OF CORRECTION

PATENT NO. : 6,233,042 B1
DATED : May 15, 2001
INVENTOR(S) : Tsuneo Kanda

It is certified that error appears in the above-identified patent and that said Letters Patent is hereby corrected as shown below:

Column 22,
Line 55, "means; and" should read -- means; --.

Signed and Sealed this

Fourth Day of December, 2001

Attest:

NICHOLAS P. GODICI
Attesting Officer
Acting Director of the United States Patent and Trademark Office